US005294474A

United States Patent [19]

Assante et al.

[11] Patent Number: 5,294,474

[45] Date of Patent: Mar. 15, 1994

[54] COMPOSITE POLYESTER FILMS AND THEIR USE AS PROTECTIVE LAYERS FOR PHOTOPOLYMER PLATES, AND PHOTOPOLYMER PLATES COMPRISING SAID FILMS

[75] Inventors: Jean-Pierre Assante, Villeurbanne; Philippe Corsi, Lyons; Didier Veyrat, S.-Cyr-au-Mont-d'Or, all of France

[73] Assignee: Rhone-Poulenc Films, Courbevoie, France

[21] Appl. No.: 820,694

[22] PCT Filed: Jul. 13, 1990

[86] PCT No.: PCT/FR90/00530

§ 371 Date: Feb. 26, 1992

§ 102(e) Date: Feb. 26, 1992

[87] PCT Pub. No.: WO91/01881

PCT Pub. Date: Feb. 21, 1991

[30] Foreign Application Priority Data

Jul. 27, 1989 [FR] France ............................... 89 10389

[51] Int. Cl.[5] ......................... B32B 27/36; G03F 7/11

[52] U.S. Cl. .................................... 428/143; 428/148; 428/328; 428/329; 428/480; 428/910; 430/271; 430/273; 430/961

[58] Field of Search ............... 428/328, 329, 480, 143, 428/148; 430/271, 273, 300

[56] References Cited

U.S. PATENT DOCUMENTS

| | | | |
|---|---|---|---|
| 3,983,285 | 9/1976 | Riboulet et al. | 428/480 |
| 4,615,939 | 10/1986 | Corsi et al. | 428/328 |
| 4,820,583 | 4/1989 | Miguel et al. | 428/480 |
| 4,828,918 | 5/1989 | Miguel et al. | 428/480 |
| 4,840,836 | 6/1989 | Eyraud | 428/480 |
| 5,047,278 | 9/1991 | Ono et al. | 428/480 |

*Primary Examiner*—Paul J. Thibodeau
*Assistant Examiner*—D. S. Nakarani
*Attorney, Agent, or Firm*—Burns, Doane, Swecker & Mathis

[57] ABSTRACT

The invention relates to semicrystalline biorientated composite polyester films comprising a thick filled or unfilled layer and, on at least one of the faces of the layer (A), a coextruded polyester layer (B) whose thickness is less than that of the layer (A) and which has the following characteristics:

$Rt \leqq 3\ \mu m$ $Rt/Ra \leqq 10$ and contains a filler having the following characteristics:

mean diameter $D\ 50 = 1.5$ to $2.5\ \mu m$ monodispersity $I = D\ 75 - D\ 25 \leqq 1.2$ These films can be used as protective sheets for the photopolymerizable layer of photopolymerizable elements.

14 Claims, No Drawings

COMPOSITE POLYESTER FILMS AND THEIR USE AS PROTECTIVE LAYERS FOR PHOTOPOLYMER PLATES, AND PHOTOPOLYMER PLATES COMPRISING SAID FILMS

BACKGROUND OF THE INVENTION

The present invention relates to novel composite polyester films having particular surface properties and to their use as protective layers for photopolymer plates.

It is known that photosensitive elements, such as the photopolymer plates used for preparing printing plates and in particular flexographic printing plates, consist of at least one assembly comprising a layer of a photopolymerizable polymer deposited between a carrier and a protective film. In general, the carrier and the protective film consist of a metal film or of films or sheets of film-forming thermoplastic polymers. Polyester films, and in particular orientated polyester films containing several units derived from an alkylene terephthalate, are a preferred material for producing said carriers or protective films for photosensitive elements. The main role of the protective film is to protect the photopolymer layer from the damage which it might sustain during the handling and/or storage of the photopolymerizable elements; it also acts as a separator when the photopolymerizable plates are stacked. The protective film is separated from the photopolymerizable layer at the moment when the photopolymerizable elements are used. In this use, it has been found advantageous to give the photopolymerizable layer a surface topography such that the plating of the surface of the element on the glass plate of the printing machines and/or on the surface of the negatives is as complete as possible.

Such an objective can only be achieved rapidly if the air trapped between the photopolymerizable layer and the glass plate can easily escape when the polymerizable element is placed in position, i.e. if the photopolymerizable layer is sufficiently rough. The protective film can advantageously impart this roughness to said layer by the transfer effect if the surface of said film in contact with the photopolymerizable layer comprises several protuberances having substantially the same height and distributed uniformly over the surface of the protective film in contact with the photopolymerizable layer. Moreover, for certain applications (for example the manufacture of offset plates) for which the photopolymerizable layer is particularly thin (its thickness can be about 3 μm), care should be taken to ensure that the rough surface of the protective film is devoid of peaks which would perforate the photopolymerizable layer. The production of polyester films having such surface properties involves the use of fillers which satisfy particular requirements in respect of their particle size, the particle size distribution and their ability not to reagglomerate when they are introduced into the polyester. Such fillers are generally introduced throughout the thickness of the protective film (so-called full-bulk film), in which case part of the fillers consumed, which does not participate in achieving the desired result, is totally wasted. Furthermore, the use of a high concentration of filler throughout the thickness of the film helps to make said film opaque, which does not allow the photopolymerizable layer to be seen through the protective layer. Finally, the scraps of full-bulk films containing a high concentration of fillers are difficult if not impossible to recycle.

SUMMARY OF THE INVENTION

A first objective of the present invention is to develop a rough protective film of uniform topography which is capable of imparting its roughness to a photopolymerizable layer.

A second objective of the present invention is to develop a rough protective film devoid of peaks which would perforate the thinnest photopolymer layers.

A third objective of the present invention consists in obtaining a rough protective film containing a high concentration of monodisperse fillers, while limiting the amount of filler used.

A fourth objective of the present invention is to obtain rough protective films of the highest possible transparency, taking the concentration of filler into account.

More precisely, the present invention relates to novel semicrystalline biaxially oriented composite polyester films comprising a thick filled or unfilled layer A and, on at least one of the faces of the layer A, a coextruded polyester layer B whose thickness is less than that of the layer A, characterized in that the layer B has the following surface characteristics:

total roughness (peak-to-valley height) $Rt \leqq 3$ μm peak density expressed as the ratio $Rt/Ra \leqq 10$ (Ra being the mean deviation roughness) and contains a filler having the following characteristics;

mean diameter = 1.5 to 2.5 μm monodispersity $I = D\ 75 - D\ 25 \leqq 1.2$ μm

The peak density of the films according to the invention is preferably between 5 and 9.

DETAILED DESCRIPTION OF THE PREFERRED EMBODIMENTS OF THE INVENTION

In the international application published under No. WO 86/06024, composite polyester films consisting of a thick unfilled layer (A) and at least one filled thin layer (B), are described, intended for the preparation of printing masters in particular to obtain offset plates. In view of this application, these composite films must satisfy strict requirements concerning on the one hand their roughness which must be sufficient to assure good machinability and good separation of the sheets in the reproduction frames, and on the other, their transparency. These contradictory requirements were reconciled by introducing small quantities (0.01 to 1% by weight) of fillers and by regulating the thickness of the filled layer (B) as a function of the thickness of the uncharged layer (A). The development of composite polyester films for the production of sheets to protect photosensitive elements with a rough photosensitive layer, which must satisfy other requirements relative to their surface topography (total roughness less than the thickness of the photosensitive layers, high density of peaks of uniform height), takes place by the application of different industrial solutions (strong contents of fillers with a high monodispersity).

The polyesters used to obtain the layers (A) and (B) of the coextruded composite films according to the invention are those normally used to obtain biaxially oriented semicrystalline films. They are film-forming linear polyesters which can be crystallized by orientation and which are conventionally obtained from one or more aromatic dicarboxylic acids or derivatives thereof (for example esters of lower aliphatic alcohols, halides)

and one or more aliphatic glycols. Examples of aromatic diacids which may be mentioned are phthalic, terephthalic, isophthalic, naphthalene-2,5-dicarboxylic and naphthalene-2,6-dicarboxylic acids. These acids can be associated with a minor amount of one or more aliphatic dicarboxylic acids such as adipic, azelaic and hexahydroterephthalic acids. Non-limiting examples of aliphatic diols which may be mentioned are ethylene glycol, propane-1,3-diol and butane-1,4-diol. These diols can be associated with a minor amount of one or more aliphatic diols containing a greater number of carbon atoms (for example neopentyl glycol) or cycloaliphatic diols (cyclohexanedimethanol). Preferably, the crystallizable film-forming polyesters are polyalkylene diol terephthalates or naphthalenedicarboxylates and in particular polyethylene glycol terephthalate (PET) or polybutane-1,4-diol terephthalate, or copolyesters containing at least 80 mol % of alkylene glycol terephthalate or naphthalenedicarboxylate units. The polyester is advantageously a polyethylene glycol terephthalate whose intrinsic viscosity, measured at 25° C. in o-chlorophenol, is between 0.6 and 0.75 dl/g.

To obtain a uniform distribution of peaks of substantially identical height on the surface of the films according to the invention, monodisperse fillers are employed, i.e. fillers characterized by a monodispersity index $I=D\ 75-D\ 25$ which is less than or equal to 1.2 μm and could be equal to zero. The terms D 75 and D 25 will be defined below. The mean diameter D 50 is defined as the diameter of a spherical particle corresponding to 50% of the weight of all the particles. Furthermore, $D_{50}$ which can be read off of the cumulative distribution. curve relating the percentage by weight to the diameter of the particles, is between 1.5 and 2.5 μm and preferably between 1.8 μm and 2.2 μm.

The nature of the fillers is not critical, provided they satisfy the monodispersity and mean diameter requirements indicated above. It is therefore possible to employ a variety of types of filler: metal salts ($CaCO_3$; $BaSO_4$) and metal oxides: $SiO_2$, $TiO_2$, $ZrO_2$, $Al_2O_3$, silica/alumina mixtures and silicates. It is preferable, however, to employ fillers which reagglomerate only slightly, or not at all, when they are introduced into the polymer. It is preferred to employ metal oxides obtained by the hydrolysis of a metal alcoholate, such as an alkyl silicate, titanate, zirconate or aluminate, in an aqueous-alcoholic medium, in the presence of an alkaline base (in particular aqueous ammonia), in accordance with the process described by W. STÖEBER et al., J. Colloid and Interface Sci. 26 (1968) 62–69, in U.S. Pat. No. 3,634,558 and in European patent application 0 234 945. The metal oxides obtained in this way take the form of monodisperse spherical particles. The monodisperse spherical oxides, and in particular the silicas obtained by the alkaline hydrolysis of alkyl silicates (methyl, ethyl, n-propyl, isopropyl silicates) in an aqueous-alcoholic medium, are most especially suitable; the silica particles may have undergone an esterification treatment on all or some of the silanol groups present on their surface in accordance with the process described in U.S. Pat. No. 2,801,185 in the name of K. ILER, and by A. K. VAN HELDEN et al., J. Colloid Interface Sci. 81 (1981) p. 354–367, by means of alcohols or polyols such as ethylene glycol. The monodisperse spherical metal oxides can be introduced into the polyester by the customary processes, i.e. during the interexchange reaction or the polycondensation, in the form of powder or, preferably, in the form of a glycol suspension (q.v. European patent application 0 236 945), or by the masterbatch technique.

In terms of the present invention, the expression "spherical particles" denotes particles with a shape factor $\phi v$ of between 0.45 and 0.523, $\phi v$ being equal to the ratio $V/D^3$ of the volume V of the particle, expressed in $\mu m^3$, to the cube of the maximum diameter of the particles.

The amount of filler introduced into the layer B depends on the nature of the filler and in particular on its density. In fact, the peak density depends directly on the number of particles of fillers present in the polymer. For a given weight of filler and a defined mean diameter, the number of particles is inversely proportional to the density of the filler. In general, the amount of filler is between 5 and 35% by weight and preferably between 5 and 25% by weight of the polymer. In the case where monodisperse silica is employed as the filler, an amount of between 5 and 15% by weight is suitable. The appropriate amount of filler can be determined in each particular case by means of simple tests for imparting to the layer (or layers) (B) a peak density, expressed as the ratio Rt/Ra, which is less than or equal to 10.

The composite films according to the present invention comprise at least one layer B such as defined above. In the case where they are used as protective layers in multilayer photopolymerizable elements, they can comprise a layer B on each face; the composite film made up in this way then acts as a spacer and protective sheet between the photopolymerizable layers of two elements. In a variant, the composite films according to the invention which comprise only one layer B can act simultaneously as protective films and as permanent carriers in multilayer photopolymerizable elements. In this case, the face carrying the layer B comes into contact with one face of the photopolymerizable layer of one element, and the other face of the composite film, which may carry an adhesive coating of known type, is in contact with the photopolymerizable layer of another element. It is thus possible to combine several photopolymerizable elements.

If the film according to the invention is intended to act both as carrier and protective sheet, that face of the layer A which does not comprise a layer B according to the invention can be provided, by any appropriate means (coextrusion, in-line coating, pick-up coating), with a layer of an adhesion primer of known type. This can be done using acrylic polymers or copolyesters containing several oxysulphonyl groups ($SO_3M$, M being a hydrogen atom or an alkali metal or alkaline earth metal atom): q.v. European patent applications published under No. 0 267 856, 0 275 801 and 0 272 993 and French patent application 88/03302 published under No. 2 628 359, or copolyesters containing grafted oxysulphonyl groups, such as those described in European patent application published under No. 0 260 203.

The coextruded composite films according to the present invention are obtained by the simultaneous extrusion of a polyester A not containing fillers or, if appropriate, containing fillers different from those in the layer B, and a polyester B containing the monodisperse spherical filler described above.

To do this, a first extruder is used to extrude a flow (A) of crystallizable polyester and, simultaneously, a second extruder is used to extrude a flow of the polyester (B) intended to form the layer or layers (B). The two extruders are connected to a coextrusion box in which the flow (B) can be divided into two flows (B) if appropriate. The streams of molten polymers are converted to a multilayer amorphous film by passage through a flat die and the resulting amorphous film is subjected to the customary operations for producing films: tempering, orientation, thermosetting and winding.

The conditions of film production are those normally used in industry to obtain orientated semicrystalline polyester films. On leaving the die, the amorphous composite film is cooled to a temperature of between 10° C. and 45° C. on a casting drum.

The conditions of orientation of the extruded composite film are those normally used in the manufacture of semicrystalline polyester films. Thus it is possible to carry out monoaxial orientation or biaxial orientation performed successively or simultaneously in two generally orthogonal directions, or else in sequences of at least 3 orientation operations in which the direction of orientation is changed for each sequence. Furthermore, each monodirectional orientation operation can itself be carried out in several steps. Thus it will be possible to combine orientation sequences such as, for example, two successive biaxial orientation treatments, it being possible for each orientation operation to be carried out in several stages.

Preferably, the composite film is subjected to biaxial orientation in two perpendicular directions. It is possible, for example, to orientate the film firstly in its direction of displacement (longitudinal orientation) and then in a perpendicular direction (transverse orientation), or vice-versa. In general, longitudinal orientation is carried out in a ratio of 3 to 5 (i.e. the length of the orientated film represents from 3 to 5 times the length of the amorphous film) at a temperature of 80° to 135° C. and transverse orientation is carried out in a ratio of 3 to 5 at a temperature of 90° to 135° C. and preferably of between 100° and 125° C.

After orientation, the composite film is subjected to a heat treatment at a temperature of between 160° and 240° C.

Orientation can also be carried out simultaneously, i.e. in the longitudinal direction and in the transverse direction at the same time, for example in a stretching ratio of 3 to 5 at a temperature of 80° to 120° C.

The output of the extruders depends on the thicknesses of the layers (A) and (B) after orientation. The layer (A) generally has a thickness of between 20 μm and 150 μm and preferably of between 30 μm and 100 μm. The thickness of the layer(s) (B) is generally less than the mean diameter of the particles of the monodisperse filler. This thickness is preferably in the range from 0.5 μm to 2 μm.

The free shrinkage factor of the composite films according to the invention, in both directions, at 150° C., is advantageously less than or equal to 2% and preferably less than or equal to 1.5%.

Although it is preferable for the layer A not to contain filler, it can prove useful, in particular if the composite film contains only one layer (B), to give it a sufficient roughness to facilitate winding, by introducing a customary filler. In this case, the mean diameter of the fillers incorporated into the layer A is preferably less than or equal to that of the fillers in the layer B and the amount of filler is less than that in the layer B. In general, this amount is less than 5% by weight and is between 0.1 and 3% by weight. This objective could be achieved by placing, on that face of (A) which is opposite the layer (B), a layer (C) containing an appropriate amount of a customary filler which is different from that in the layer (B).

If the composite films according to the invention comprise two layers (B), it is not necessary for the layer (A) to contain a filler, but it would not exceed the framework of the invention to introduce into the layer (A) a customary filler which is different from the monodisperse filler in the layers (B).

The films according to the present invention in which the layer (A) is devoid of filler have a haziness of less than 80%. All other things being equal, a full-bulk film is totally opaque.

The composite films according to the invention are most especially suitable as protective films for photopolymerizable elements for the manufacture of printing plates, in particular by the flexographic printing process. This use constitutes a second subject of the present invention.

A third subject of the present invention is photopolymerizable elements for printing plates, which consist of at least one assembly comprising essentially a carrier, a photopolymerizable layer and a protective film, characterized in that said protective film consists of a coextruded biaxially oriented composite polyester film comprising a thick layer (A) which may or may not contain a filler, and, on at least one of the faces of said layer (A), a polyester layer (B) whose thickness is less than that of the layer (A) and which has the following surface characteristics:

$Rt \leqq 3$ μm peak density $Rt/Ra \leqq 10$ said layer (B) containing a filler having the following characteristics:

mean diameter = 1.5 μm to 2.5 μm monodispersity $I \leqq 1.2$ μm

In the photopolymerizable elements according to the present invention, the carrier and the polymerizable layer are those which are in common use (q.v. U.S. Pat. Nos. 2,948,611, 3,024,180 and 4,323,637; Research Disclosure 86/188 103). The permanent carrier for the photopolymerizable layer can consist of any material in the form of a sheet, film or plate. Thus it is possible to employ films, sheets or plates made of metal (for example aluminium) or based on film-forming polymers (vinyl polymers or copolymers, polyesters, polyamides, polyimides, polyester-amides). Polyester films, sheets or plates are most especially suitable. The permanent carrier can, if necessary, carry a layer of an adhesive for improving its bonding to the photopolymerizable layer.

The photopolymerizable elements according to the present invention can consist of one or more assemblies composed essentially of a permanent carrier, a photopolymerizable layer and a protective film according to the invention. As described above, in an element composed of two photopolymerizable assemblies, the protective film comprises a layer (B) on each face and acts as a spacer between 2 photopolymerizable layers of two elements. In elements comprising more than two assemblies, the protective film consists of that face of the carrier of the adjacent assembly which carries a layer (B).

EXAMPLES

The following Examples, which are given without implying a limitation, illustrate the invention and show how it can be put into practice. The properties of the fillers and the composite films are defined below and their methods of measurement are described.

A) Characteristics of the films

1°-Roughnesses a) Mean deviation: roughness Ra (or CLA)

This characteristic, defined in standard DIN 4.768, was measured on a PERTHEN S6P ® apparatus by the method described in this standard, under the following conditions:

| | |
|---|---|
| value of the cut-off wavelength: | 0.08 mm |
| tracking length: | 1.75 mm |
| radius of curvature of the stylus instrument: | 4 μm |
| tracking force of the stylus instrument: | 50 mg.f |

The result recorded is the mean of 30 measurements made on profiles 20 μm apart.

b) Total roughness (peak-to-valley height) measured under the same conditions as Ra 2°-Peak density This is expressed as the ratio Rt/Ra, measured as described above.

3°-Shrinkage at 150° C.

Circular test pieces of diameter 100 mm are cut out of a polyester film after identification of the directions of transverse orientation and longitudinal orientation of the film. The test pieces are then heated at 150° C. for 30 min in a thermostated ventilated oven. After cooling, the diameters of the test pieces are determined in the transverse direction (DT) and in the longitudinal direction (DL) by means of a measuring block consisting of a measuring scale with 0.1 mm graduations, etched on an illuminated glass plate, and of a telescopic sight. The shrinkage is expressed and calculated by means of the following formulae:

RT=100-DT

RL=100-DL

4°-Haziness

The percentage of transmitted scattered light (or haze) characterizes the haziness of the films. It is determined according to standard ASTM D 100.

B) Characteristics of the fillers in the layer B

1°—Mean diameter of the particles, D 50, defined above: this is measured using a laser granulometer of trademark SYMPATEC ® in an aqueous solution of sodium pyrophosphate.

2°—D 75 and D 25, which respectively represent the diameter of a spherical particle corresponding to 75 and 25% by weight of all the particles, read off on the cumulative distribution curve relating the percentage by weight of particles to their diameter, are measured in the same manner as D 50.

EXAMPLE 1 a) Preparation of a masterbatch

A masterbatch consisting of 85% by weight of a filler-free polyethylene glycol terephthalate with a viscosity index of 740, and 15% by weight of a monodisperse spherical silica sold under the trademark MICROBEAD P400 ® and having the following characteristics:

D 50 in μm: 1.95
D 25 in μm: 1.55
D 75 in μm: 2.41
I in μm: 0.86 containing 0.12% by weight of particles with a minimum diameter of 0.62 μm and 0.98% by weight of particles with a maximum diameter of 4.2 μm, is prepared by introducing the constituents into a twin screw extruder of trademark LEISTRITZ ®, with a diameter of 354 mm and a length equal to 35 times the diameter, and extruding the mixture at a rate of 10 kg/hour, the devolatilization pressure being $7\times10^3$ Pa and the speed of rotation of the screw being 100 rpm. The rod obtained is cooled with cold water and then dried in a stream of hot air and converted to granules.

A secondary masterbatch, containing 10% by weight of silica, is obtained by the above procedure, starting from the same unfilled PET and the 15% masterbatch prepared above. The viscosity index of the secondary masterbatch is 640.

b) Preparation of a B/A/B composite polyester film

A composite polyester film comprising an unfilled internal layer A with a thickness of 72 μm, and, on each face of A, a layer B with a thickness of 1.5 μm, is prepared by coextrusion of the filler-free PET used for the preparation of the masterbatch, on the one hand, and the secondary masterbatch containing 10% of silica, on the other, by means of a device comprising two extruders connected to a junction box which divides the flow (B) of filled polymer into two secondary flows (B).

The output of the principal extrusion line (flow A) is 120 kg/h and its temperature is 280° C. The satellite line has an output of 5 kg/hour and a temperature of between 265° C. and 270° C. and the inlet pressure in the junction box is between $6\times10^6$ Pa and $9\times10^6$ Pa.

The three streams B/A/B are extruded through a flat die. The coextruded mass is cooled by plating on to a casting drum kept at 35° C., and the amorphous composite film is then subjected to longitudinal orientation in a ratio of 3.24 at a temperature of 105° C. and subsequently to transverse orientation in a ratio of 3.27 at a temperature of between 115° C. and 125° C. The biorientated film then undergoes a thermosetting heat treatment at a temperature of 230° C. for 5 sec, after which it is cooled and wound.

The film obtained in this way has the following properties:

1°-Roughnesses

Ra: 0.31 μm
Rt: 2.38 μm
Rt/Ra: 7.68

Shrinkage factor at 150° C.

longitudinal direction: 0.98%
transverse direction: 0.45%
haziness: 73.7%

EXAMPLE 2

A composite film of the B/A/B type, with a total thickness of 75 μm, was prepared by the process of Example 1, the PET containing 10% of silica being replaced with a PET containing 7% of silica, obtained from the appropriate amounts of masterbatch containing 10% of silica and unfilled PET.

This gave a composite film having the following properties:

1°—Roughnesses

Ra: 0.281 μm
Rt: 2.36 μm
Rt/Ra: 8.39

Shrinkage factor at 150° C.

longitudinal direction: 1.05%
transverse direction: 0.5%
haziness: 69.7%

EXAMPLE 3

A composite film of the B/A/B type was prepared by the process of Example 1, the PET containing 10% of silica being replaced with a PET containing 5% of silica, obtained by mixing the appropriate amounts of masterbatch containing 10% of silica and unfilled PET. The film obtained has the following properties:

1°—Roughnesses

Ra: 0.243 μm
Rt: 1.79 μm
Rt/Ra: 7.36

Shrinkage factor at 150° C.

longitudinal direction: 0.95%
transverse direction: 0.53%
haziness: 58.5%

EXAMPLE 4

1°—Preparation of a polymer containing 10% by weight of silica

A polyethylene glycol terephthalate containing 10% by weight of monodisperse spherical silica of trademark MICROBEAD P400® was prepared in a 300-litre autoclave starting from 120 kg of dimethyl terephthalate and 93.3 kg of a suspension of 13.3 kg of silica in 80 kg of ethylene glycol, in the presence of calcium acetate (175 parts per million), antimony trioxide (350 parts per million) and orthophosphoric acid (54 parts per million).

The polymer obtained in this way has an intrinsic viscosity of 80, measured on a 25% solution in orthochlorophenol.

2°—Preparation of composite film

A composite film of the B/A/B type was prepared by the process of Example 1 by coextrusion of an unfilled polyester and the filled polyester obtained above.

The composite film obtained in this way has the following characteristics:

Ra: 0.32 μm
Rt: 2.42 μm
Rt/Ra: 7.56
haziness: 60%

COMPARATIVE EXAMPLE 1

A composite film in which the layers (B) contain 2% by weight of MICROBEAD P400® silica was prepared by the process of Example 1. The film obtained has the following characteristics:

Ra: 0.126 μm
Rt: 1.80 μm
Rt/Ra: 14
haziness: 21

This film, in which the peak density is too low, is unsuitable for use as a protective film for photopolymerizable plates.

COMPARATIVE EXAMPLE 2

Composite films in which the layers (B) contain variable amounts of barium sulphate (trademark BLANC FIXE H) were prepared by the process of Example 1. The characteristics of the films obtained are shown in the following Table. The barium sulphate had the following characteristics:

D 50 in μm: 2.04
D 75 in μm: 2.9
D 25 in μm: 1.36
I in μm: 1.54

| EX. C | FILLER % by weight | FILLER D 50 | FILLER I μm | FILM Rt μm | FILM Ra μm | FILM Rt/Ra | FILM haziness |
|---|---|---|---|---|---|---|---|
| 1 | 10 | 2.04 | 1.54 | 2.09 | 0.11 | 19 | 49 |
| 2 | 7 | " | " | 1.88 | 0.087 | 21.5 | 37 |
| 3 | 5 | " | " | 1.46 | 0.063 | 23.17 | 27 |

The films obtained in this way are not suitable for use as protective films for photopolymer plates because the peak density is too high.

We claim:

1. Semicrystalline biaxially oriented composite polyester film comprising a filled or unfilled polyester layer (A) and, on at least one of the faces of the layer (A), a coextruded polyester layer (B) whose thickness is less than that of the layer A, wherein the layer (B) has the following surface characteristics:

(a) total roughness Rt≦3 μm;

(b) peak density Rt/Ra≦10 where Ra is the mean deviation roughness, and contains from 5 to 35% by weight of a filler having the following characteristics:

(i) mean diameter D 50=1.5 to 2.5 μm (ii) monodispersity I≦1.2 μm.

2. Semicrystalline biaxially oriented composite polyester films according to claim 1, wherein the filler comprises substantially spherical particles of at least one metal oxide.

3. Semicrystalline biaxially oriented composite polyester films according to claim 2, wherein the thickness of the layer (B) is less than the mean diameter of the particles of filler which it contains.

4. Semicrystalline biaxially oriented composite polyester films according to claim 3, wherein the filler is silica.

5. Semicrystalline biaxially oriented composite polyester films according to claim 4, wherein the amount of filler is between 5 and 15% by weight of the polyester forming layer (B).

6. The semicrystalline biaxially oriented composite polyester film according to claim 5 wherein the peak density is between 5 and 9.

7. A method of using the semicrystalline biaxially oriented composite polyester film according to 1, 2, 3, 4, 5 or 6, as protective sheets for the photopolymerizable layer of photopolymerizable element for a printing plate by placing a face of the film containing layer (B) in contact with the photopolymerizable layer.

8. Photopolymerizable elements for a printing plate comprising at least one assembly which comprises a carrier, a photopolymerizable layer and a protective film, wherein the protective film comprises a coextruded biaxially oriented composite polyester film according to 1, 2, 3, 4, 5 or 6 and further wherein a face with of the film containing layer (B) is in contact with the photopolymerizable layer.

9. Photopolymerizable elements for a printing plate comprising two assemblies each comprising a carrier and a photopolymerizable layer, wherein the two photopolymerizable layers are separated by a protective sheet comprising a semicrystalline biaxially oriented composite polyester film according to 1, 2, 3, 4, 5 or 6, which has a layer (B) on each face of the layer (A).

10. Photopolymerizable elements for a printing plate comprising at least three assemblies each comprising a carrier, a photopolymerizable layer and a protective sheet, wherein each photopolymerizable layer of the element is separated from an adjacent photopolymerizable layer by a composite polyester film according to 1, 2, 3, 4, 5 or 6, in which layer (B) is on only one of the faces of the layer (A).

11. Photopolymerizable elements according to claim 10, wherein the face of the layer (A) which is devoid of a layer (B) has a layer of a coating which promotes adhesion to the photopolymerizable layer.

12. The polyester film according to claim 1 wherein the mean diameter D 50 is between about 1.8 microns and 2.2 microns.

13. The polyester film according to claim 1 wherein the thickness of layer (A) is between 20 microns and 150 microns.

14. The polyester film according to claim 13 wherein the thickness of layer (B) is between 0.5 microns and 2 microns.

* * * * *